United States Patent
Kobayashi et al.

(10) Patent No.: US 9,445,026 B2
(45) Date of Patent: Sep. 13, 2016

(54) SOLID-STATE IMAGE SENSOR

(71) Applicant: CANON KABUSHIKI KAISHA, Tokyo (JP)

(72) Inventors: Masahiro Kobayashi, Tokyo (JP); Hideaki Takada, Yokohama (JP); Toshiaki Ono, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/816,372

(22) Filed: Aug. 3, 2015

(65) Prior Publication Data

US 2015/0341579 A1 Nov. 26, 2015

Related U.S. Application Data

(63) Continuation of application No. 13/741,228, filed on Jan. 14, 2013, now Pat. No. 9,153,610.

(30) Foreign Application Priority Data

Jan. 18, 2012 (JP) .................................. 2012-008447
Dec. 25, 2012 (JP) .................................. 2012-281754

(51) Int. Cl.
*H04N 5/374* (2011.01)
*H01L 27/146* (2006.01)
(Continued)

(52) U.S. Cl.
CPC ................. *H04N 5/374* (2013.01); *G06T 5/20* (2013.01); *H01L 27/14601* (2013.01); *H01L 27/14603* (2013.01); *H01L 27/14607* (2013.01); *H01L 27/14609* (2013.01); *H01L 27/14621* (2013.01);
(Continued)

(58) Field of Classification Search
CPC .................. H01L 27/14601; H01L 27/14603; H01L 27/14609; H01L 27/14621; H01L 27/14623; H01L 27/14636; H01L 27/14641; H04N 5/335; H04N 5/374; H04N 5/3742
USPC .......................... 348/294, 302, 308, 321, 323
See application file for complete search history.

(56) References Cited

U.S. PATENT DOCUMENTS 4,709,259 A 11/1987 Suzuki
7,283,305 B2 10/2007 Okita et al.
(Continued)

FOREIGN PATENT DOCUMENTS

CN 101872774 A 10/2010
CN 102244741 A 11/2011
(Continued)

OTHER PUBLICATIONS

Jul. 31, 2015 Chinese Office Action concerning corresponding Chinese Patent Application No. 201310018720.6.
(Continued)

*Primary Examiner* — Timothy J Henn
(74) *Attorney, Agent, or Firm* — Fitzpatrick, Cella, Harper & Scinto

(57) ABSTRACT

A solid-state image sensor comprising a pixel array in which a plurality of pixels are arrayed in a matrix having a plurality of rows and a plurality of columns, wherein the pixel array includes a first wiring layer and a second wiring layer arranged above the first wiring layer, the first wiring layer includes first column signal lines arranged at the respective columns of the pixel array, and the second wiring layer includes second column signal lines arranged at the respective columns of the pixel array.

10 Claims, 20 Drawing Sheets

(51) Int. Cl.
*H04N 5/335* (2011.01)
*H04N 5/369* (2011.01)
*H04N 5/376* (2011.01)
*H04N 5/378* (2011.01)
*G06T 5/20* (2006.01)

(52) U.S. Cl.
CPC ... *H01L 27/14623* (2013.01); *H01L 27/14627* (2013.01); *H01L 27/14636* (2013.01); *H01L 27/14645* (2013.01); *H04N 5/335* (2013.01); *H04N 5/3692* (2013.01); *H04N 5/3698* (2013.01); *H04N 5/378* (2013.01); *H04N 5/3765* (2013.01); *G06T 2207/10024* (2013.01)

(56) References Cited

U.S. PATENT DOCUMENTS

| | | |
|---|---|---|
| 7,462,810 B2 | 12/2008 | Kobayashi et al. |
| 7,538,804 B2 | 5/2009 | Okita et al. |
| 7,557,847 B2 | 7/2009 | Okita et al. |
| 7,629,568 B2 | 12/2009 | Koizumi et al. |
| 7,928,477 B2 | 4/2011 | Kobayashi et al. |
| 7,935,995 B2 | 5/2011 | Watanabe et al. |
| 7,986,353 B2 | 7/2011 | Ono |
| 8,045,034 B2 | 10/2011 | Shibata et al. |
| 8,106,343 B2 | 1/2012 | Arishima et al. |
| 8,289,432 B2 | 10/2012 | Shibata et al. |
| 8,310,575 B2 | 11/2012 | Sato |
| 8,451,360 B2 | 5/2013 | Nakamura et al. |
| 8,582,009 B2 | 11/2013 | Kono et al. |
| 8,717,471 B2 | 5/2014 | Sato |
| 9,153,610 B2 * | 10/2015 | Kobayashi ........ H01L 27/14601 |
| 2003/0141564 A1 | 7/2003 | Kondo et al. |
| 2005/0179796 A1 | 8/2005 | Okita et al. |
| 2007/0181923 A1 | 8/2007 | Tanaka |
| 2007/0210398 A1 | 9/2007 | Ohtsuki et al. |
| 2009/0322917 A1 | 12/2009 | Kyogoku et al. |
| 2010/0060762 A1 | 3/2010 | Takada et al. |
| 2010/0091161 A1 | 4/2010 | Suzuki |
| 2010/0271523 A1 | 10/2010 | Hara |
| 2011/0032379 A1 | 2/2011 | Kobayashi et al. |
| 2011/0068252 A1 | 3/2011 | Kawabata et al. |
| 2011/0080493 A1 | 4/2011 | Kono et al. |
| 2011/0169996 A1 | 7/2011 | Takada et al. |
| 2011/0273598 A1 | 11/2011 | Ogino et al. |
| 2012/0033118 A1 | 2/2012 | Lee et al. |
| 2012/0098081 A1 | 4/2012 | Horiike et al. |
| 2013/0083225 A1 | 4/2013 | Minowa et al. |
| 2013/0181115 A1 | 7/2013 | Ono |

FOREIGN PATENT DOCUMENTS

| | | |
|---|---|---|
| EP | 1569277 A2 | 8/2005 |
| JP | 2005-217366 A | 8/2005 |
| WO | 2010/061756 A1 | 6/2010 |

OTHER PUBLICATIONS

May 22, 2014 partial European Search Report in corresponding to foreign counterpart application European Patent Application No. 13151168.5.

Sep. 23, 2014 extended European Search Report in corresponding to foreign counterpart application European Patent Application No. 13151168.5.

* cited by examiner

FIG. 6

|    | H1 | H2 | H3 | H4 |
|----|----|----|----|----|
| L1 | GR | RD | GR | RD |
| L2 | BL | GB | BL | GB |
| L3 | GR | RD | GR | RD |
| L4 | BL | GB | BL | GB |

F I G. 16
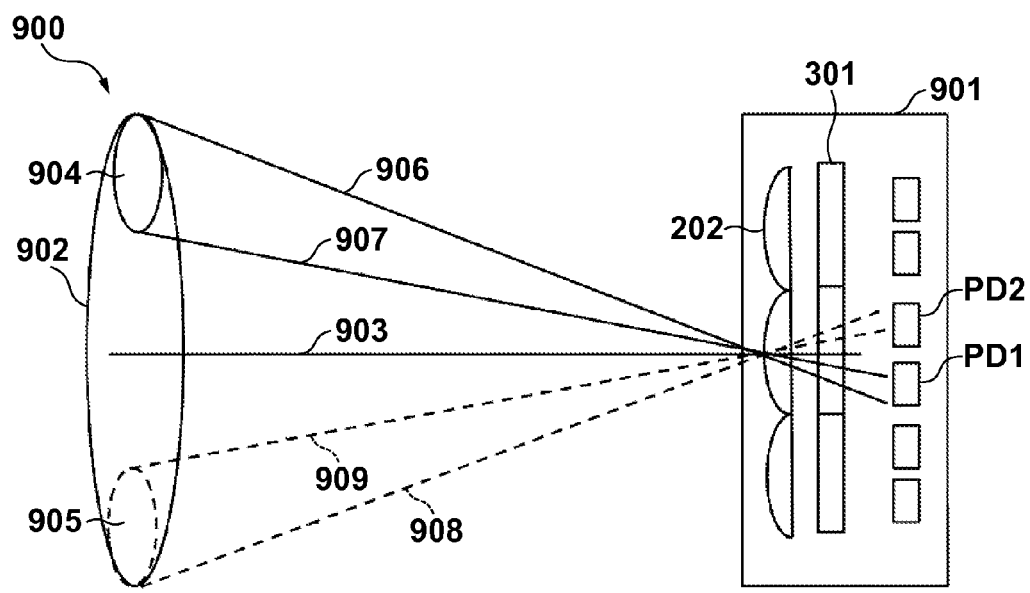

F I G. 17A
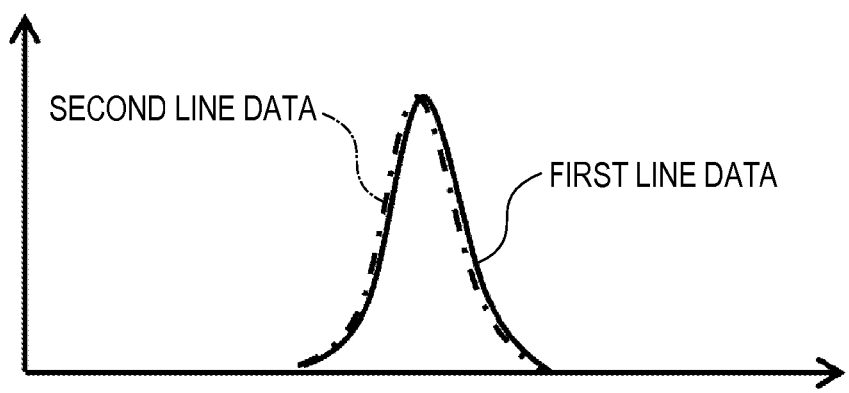
F I G. 17B
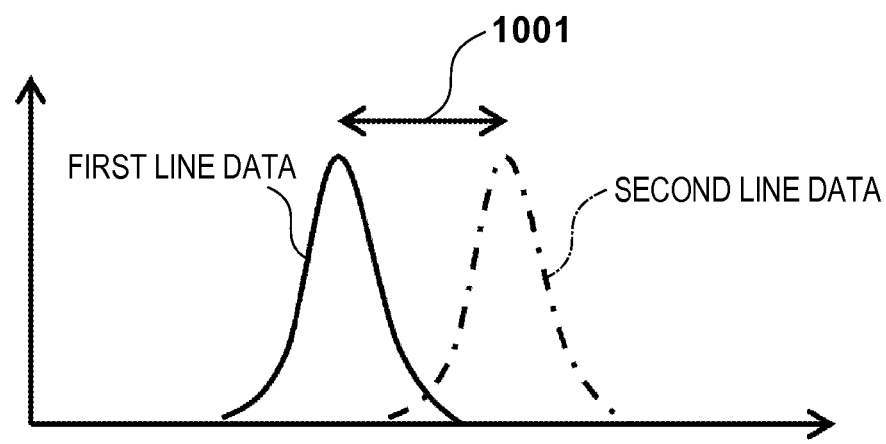

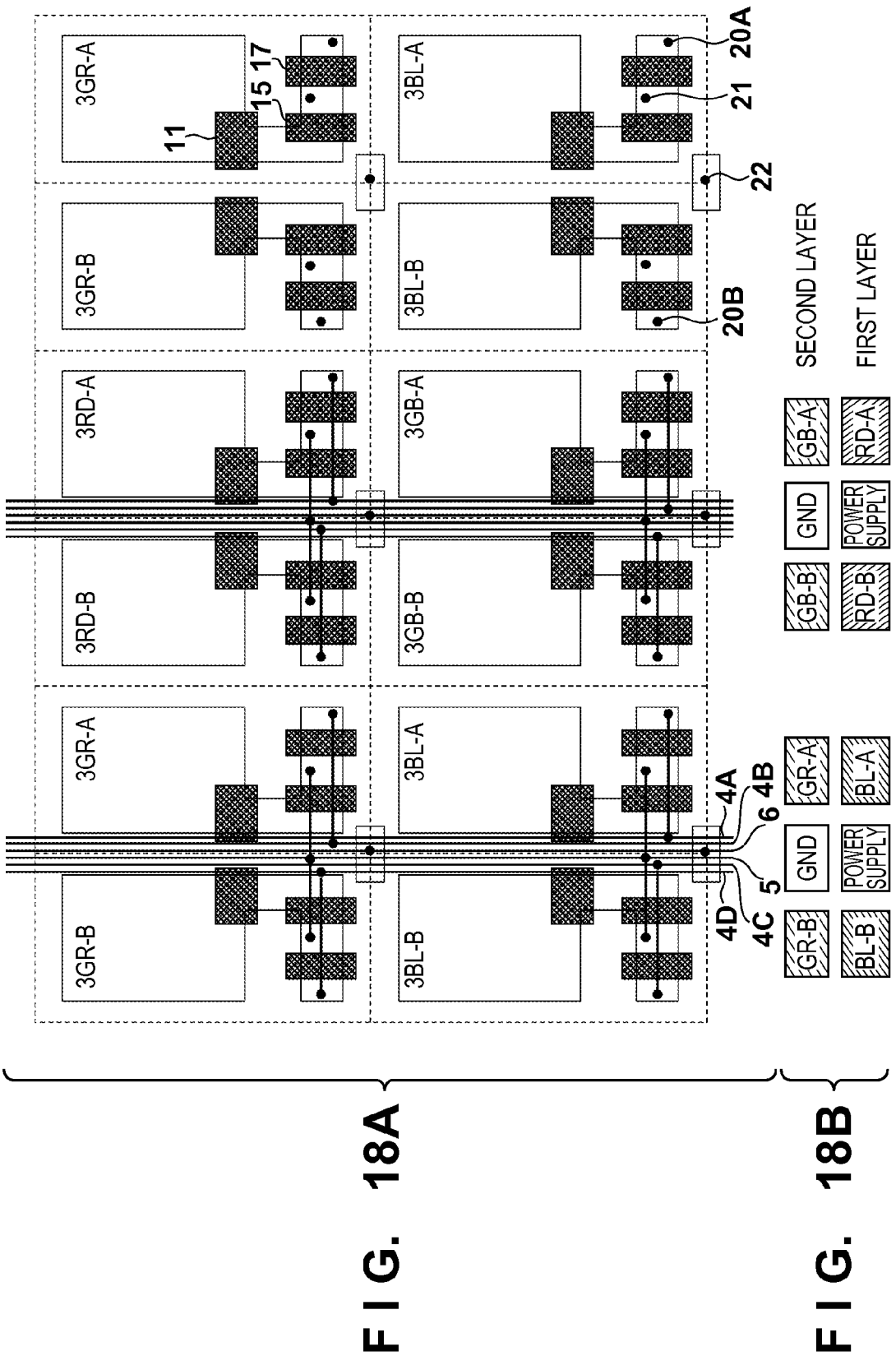
F I G. 18A
F I G. 18B

SOLID-STATE IMAGE SENSOR

This application is a continuation of application Ser. No. 13/741,228, filed Jan. 14, 2013, which has been allowed.

BACKGROUND OF THE INVENTION

1. Field of the Invention

The present invention relates to a solid-state image sensor.

2. Description of the Related Art

In a solid-state image sensor, a plurality of column signal lines can be arranged at each column of a pixel array in order to increase the reading speed of the pixel array in which a plurality of pixels are arrayed in a matrix, and to individually read out signals from two photoelectric conversion portions in a unit pixel. For example, a shield pattern can be interposed between these column signal lines to prevent so-called crosstalk in which signals from column signal lines interfere with each other.

As the numbers of column signal lines and shield patterns increase, the aperture ratio of each pixel of the solid-state image sensor may decrease because these wiring lines block incident light.

SUMMARY OF THE INVENTION

The present invention provides a technique advantageous for suppressing a decrease in aperture ratio caused by an increase in the number of wiring lines.

One of the aspects of the present invention provides a solid-state image sensor comprising a pixel array in which a plurality of pixels are arrayed in a matrix having a plurality of rows and a plurality of columns, wherein the pixel array includes a first wiring layer and a second wiring layer arranged above the first wiring layer, the first wiring layer includes first column signal lines arranged at the respective columns of the pixel array, and the second wiring layer includes second column signal lines arranged at the respective columns of the pixel array.

Further features of the present invention will become apparent from the following description of exemplary embodiments with reference to the attached drawings.

BRIEF DESCRIPTION OF THE DRAWINGS

FIG. 6 is a view for explaining the Bayer arrangement of the pixel array;

FIG. 16 is a view for explaining an example of a focus detection operation by a phase-difference detection method;

FIGS. 17A and 17B are graphs for explaining the phase-difference detection method;

FIGS. 18A and 18B are views for explaining another example of the arrangement of the solid-state image sensor;

DESCRIPTION OF THE EMBODIMENTS

First Embodiment

Figure 1:
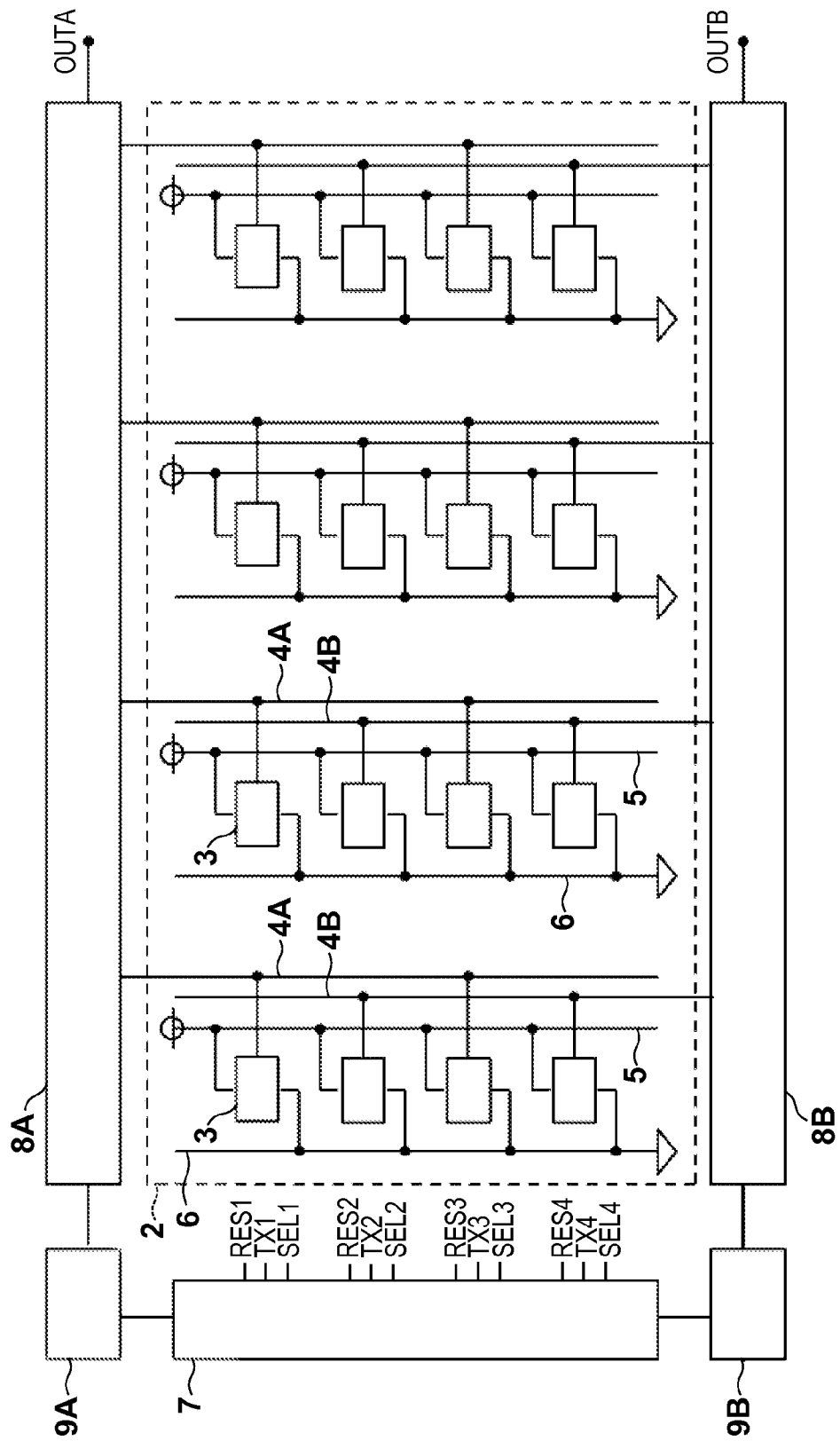
FIG. 1 is a block diagram for explaining an example of the arrangement of a solid-state image sensor according to the first embodiment.

A solid-state image sensor $1_1$ according to the first embodiment will be described with reference to FIGS. 1 to 5B. FIG. 1 is a block diagram for explaining the arrangement of the solid-state image sensor $1_1$. The solid-state image sensor $1_1$ includes a pixel array 2 in which a plurality of pixels 3 are arrayed in a matrix having a plurality of rows and a plurality of columns. For descriptive convenience, the pixel array 2 illustrated has 4×4 pixels 3. First column signal lines 4A and second column signal lines 4B are arranged to transfer pixel signals read out from the pixel array 2 to horizontal scanning circuits 8A and 8B, respectively. The pixel signals of the pixels 3 on odd-numbered rows (first and third rows) in the pixel array 2 are output to the first column signal lines 4A. The pixel signals of the pixels 3 on even-numbered rows (second and fourth rows) are output to the second column signal lines 4B. Power supply wiring 5 and power supply wiring 6 are arranged at each column of the pixel array 2. A timing control circuit 9A can output a control signal to the horizontal scanning circuit 8A to control the processing timing of a pixel signal. Similarly, a timing control circuit 9B can output a control signal to the horizontal scanning circuit 8B. A vertical scanning circuit 7 can output control signals RES1, TX1, SEL1, and the like to the respective pixels 3 of the pixel array 2 to read out pixel signals. Although the connections of the control signals RES1, TX1, SEL1, and the like to the pixel array 2 are omitted, the pixel 3 is controlled as follows. Each of the horizontal scanning circuits 8A and 8B can include, for example, a noise suppression circuit, amplifier circuit, and analog-to-digital conversion circuit. With this arrangement, each pixel signal output from the pixel array 2 by the vertical scanning circuit 7 can undergo a signal process by the horizontal scanning circuit 8A or 8B, and can be read out.

Figure 2:
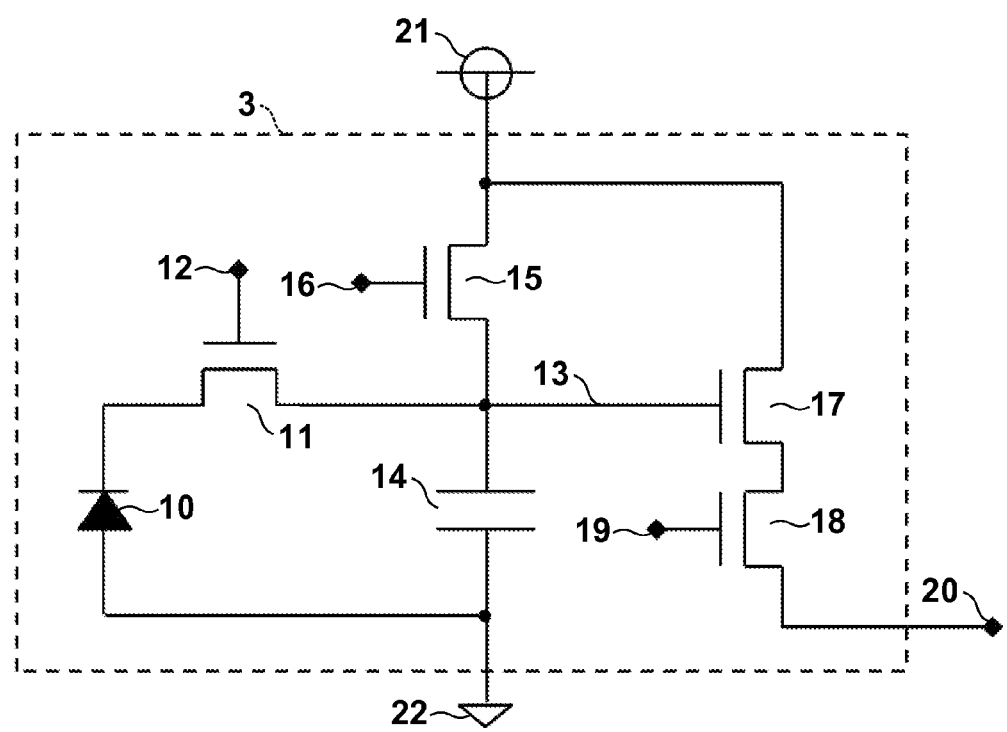
FIG. 2 is a circuit diagram for explaining an example of the arrangement of a unit pixel.

FIG. 2 exemplifies the arrangement of the circuit of the pixel 3 (unit pixel). The pixel 3 includes a photoelectric conversion portion 10 (for example, photodiode), transfer transistor 11, floating diffusion capacitor 14, reset transistor 15, source follower transistor 17, and selection transistor 18.

In the pixel 3, VDD power is supplied to a power supply terminal 21 (the power supply wiring 5 is connected to it), and the ground potential is supplied to a power supply terminal 22 (the power supply wiring 6 is connected to it). The control signal TX1 is supplied to a gate terminal 12 of the transfer transistor 11. When the control signal TX1 is activated, charges which are generated upon receiving light and accumulated in the photoelectric conversion portion 10 are transferred by the transfer transistor 11 to the floating diffusion capacitor 14. The amount of current flowing through the source follower transistor 17 can change depending on potential fluctuations at a node 13, that are caused by charges transferred to the floating diffusion capacitor 14. The control signal SEL1 is supplied to a gate terminal 19 of the selection transistor 18. When the control signal SEL1 is activated, the selection transistor 18 can output a pixel signal corresponding to the current amount of the source follower transistor 17 from a pixel signal output portion 20. As exemplified in FIG. 1, the pixel signal output portion 20 is connected to the first or second column signal line 4A or 4B. The control signal RES1 is supplied to the gate terminal of the reset transistor 15. When the control signal RES1 is activated, the reset transistor 15 can reset the potential of the node 13.

Figure 3:
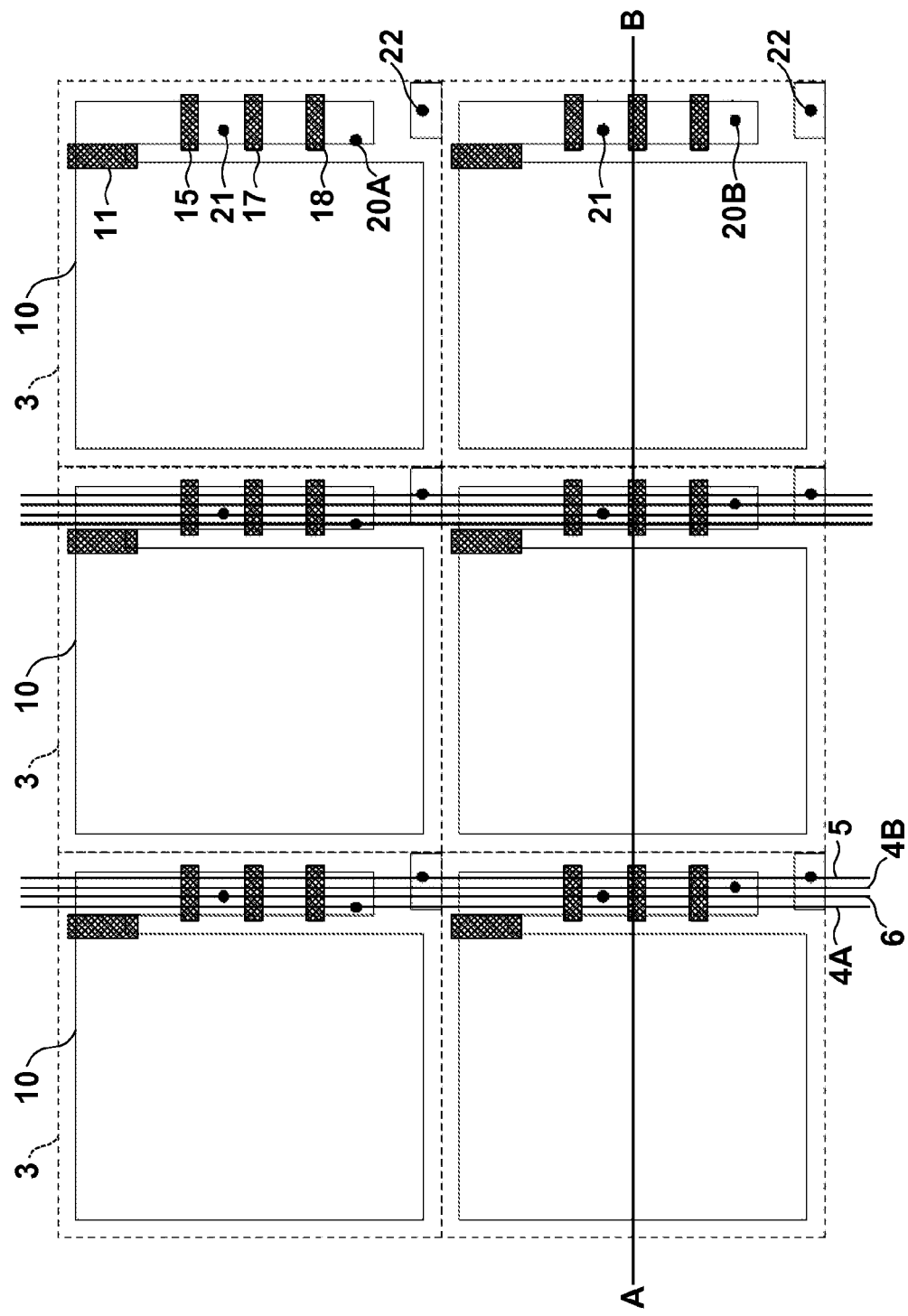
FIG. 3 is a plan view for explaining an example of the layout of a pixel array according to the first embodiment.

FIG. 3 is a plan view schematically showing the layout of 2×3 pixels 3 in the pixel array 2 of the solid-state image sensor $1_1$. For illustrative convenience of FIG. 3, the illustration of wiring lines for the control signals RES1, TX1, SEL1, and the like is omitted. For the pixels 3 on the third column, the illustration of the first and second column signal lines 4A and 4B, the power supply wiring 5, and the power supply wiring 6 is omitted.

Figure 4:
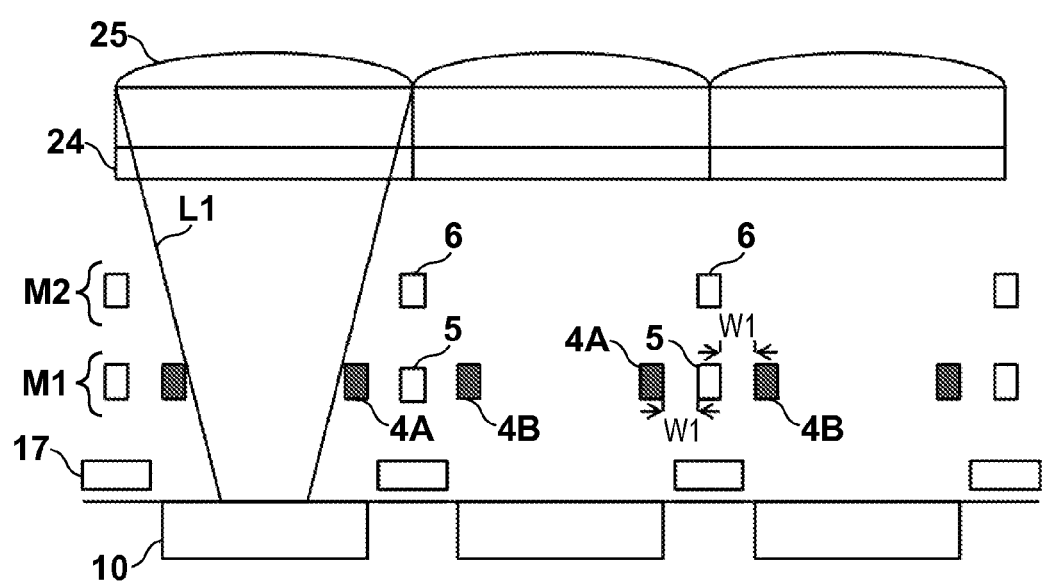
FIG. 4 is a view for explaining a reference example of the arrangement of a solid-state image sensor.

As a reference example, FIG. 4 schematically shows a typical structure in which the first and second column signal lines 4A and 4B are arranged in the same wiring layer in a sectional structure along a cutline A-B in FIG. 3. On the left side of FIG. 4, the photoelectric conversion portion 10 receives light entering a microlens 25 via a color filter 24. The pixel array 2 includes a first wiring layer M1, and a second wiring layer M2 arranged above it. The first wiring layer M1 can be, for example, a lowermost layer among a plurality of wiring layers. In this reference example, both the first and second column signal lines 4A and 4B are arranged in the first wiring layer M1. A conductive shield pattern (for example, the power supply wiring 5) is interposed between the first column signal line 4A and the second column signal line 4B. The first column signal line 4A, power supply wiring 5, and second column signal line 4B are spaced apart from each other at an inter-wiring distance W1 (for example, the critical dimension which can be decided by the manufacturing process). Another shield pattern (for example, the power supply wiring 6) is arranged in the second wiring layer M2. The power supply wiring 5 for VDD power and the power supply wiring 6 for ground (GND) can be used as these shield patterns, as in the embodiment, or wiring lines which receive other reference potentials may also be used. A solid line L1 indicates a range where the optical path of light entering the microlens 25 is not blocked by the first and second column signal lines 4A and 4B.

Figure 5A:
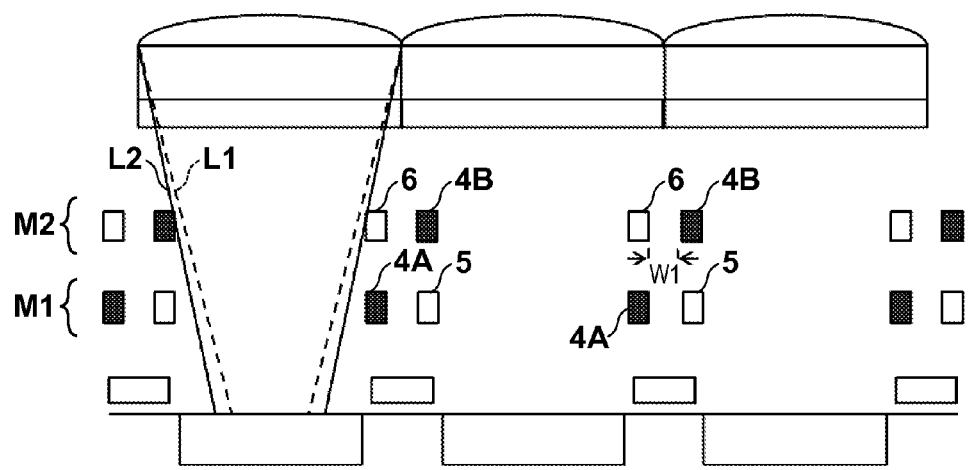
FIGS. 5A and 5B are views for explaining an example of the arrangement of the solid-state image sensor according to the first embodiment.

FIG. 5A schematically shows a sectional structure along the cutline A-B when the embodiment is applied. The first wiring layer M1 includes the first column signal line 4A arranged at each column of the pixel array 2. The second wiring layer M2 includes the second column signal line 4B arranged at each column of the pixel array 2. At least the first wiring layer M1 out of the first wiring layer M1 and second wiring layer M2 preferably further includes a conductive shield pattern. The shield pattern (in this case, the power supply wiring 5) is arranged adjacent to the first column signal line 4A of the first wiring layer M1. The second column signal line 4B is arranged at a position shifted from a position immediately above the first column signal line 4A. The second wiring layer M2 also includes another shield pattern (in this case, the power supply wiring 6). This shield pattern is arranged adjacent to the second column signal line 4B. A solid line L2 shown in FIG. 5A indicates a range where the optical path of light entering the microlens 25 is not blocked by the second column signal line 4B and the shield pattern (power supply wiring 6). A broken line L1 shown in FIG. 5A is identical to the solid line L1 in the reference example (FIG. 4). A comparison between L1 and L2 reveals that the photoelectric conversion portion 10 can receive a larger amount of light thanks to the wiring arrangement in the embodiment. This phenomenon stands out more in the peripheral region of the pixel array 2 than in the center region.

As described above, according to the first embodiment, a plurality of column signal lines are arranged in different wiring layers. This arrangement can reduce an area where the optical path is blocked, and suppress a decrease in the aperture ratio of the solid-state image sensor $1_1$. As another effect of the first embodiment, crosstalk noise between column signal lines can be suppressed by shifting the position of the second column signal line 4B arranged in the second wiring layer M2 from a position immediately above the first column signal line arranged in the first wiring layer M1. As the crosstalk noise suppression method, shield patterns can be arranged above and below the column signal line and on the left and right sides of it. However, in the first embodiment, a shield pattern is arranged only on one side of the column signal line, or above or below it. The first embodiment can therefore suppress an image signal propagation delay arising from the wiring capacitance.

Figure 5B:
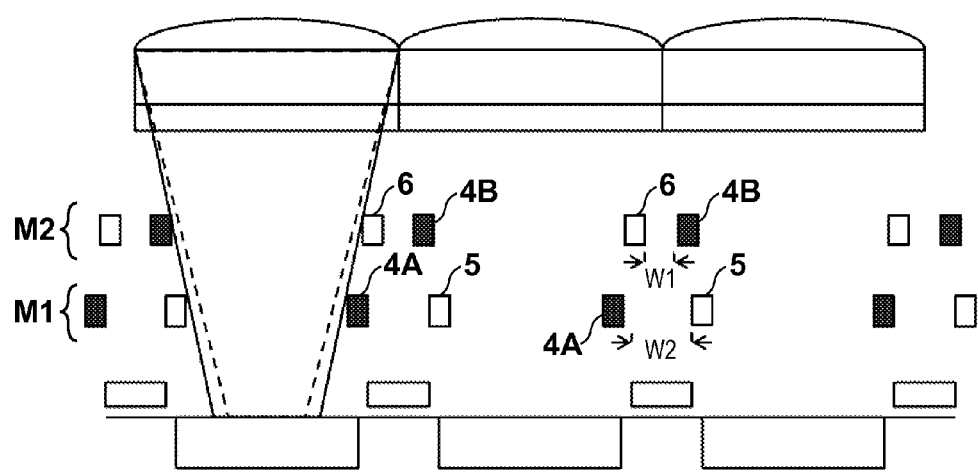

FIG. 5B schematically shows an application example in which the wiring position is changed from that in the structure of FIG. 5A. More specifically, the first column signal line 4A and the shield pattern (power supply wiring 5) in the first wiring layer M1 are arranged at a large distance W2 which nevertheless does not hamper the range (solid line L2) of the optical path shown in FIG. 5A. The distance W2 is decided within a range where the capacitance value difference between the wiring capacitance of the first column signal line 4A and that of the second column signal line 4B falls below a permissible value. This can further reduce, for example, generation of a short circuit between wiring lines in the wiring formation process, and increase the yield.

Second Embodiment

Figure 7:
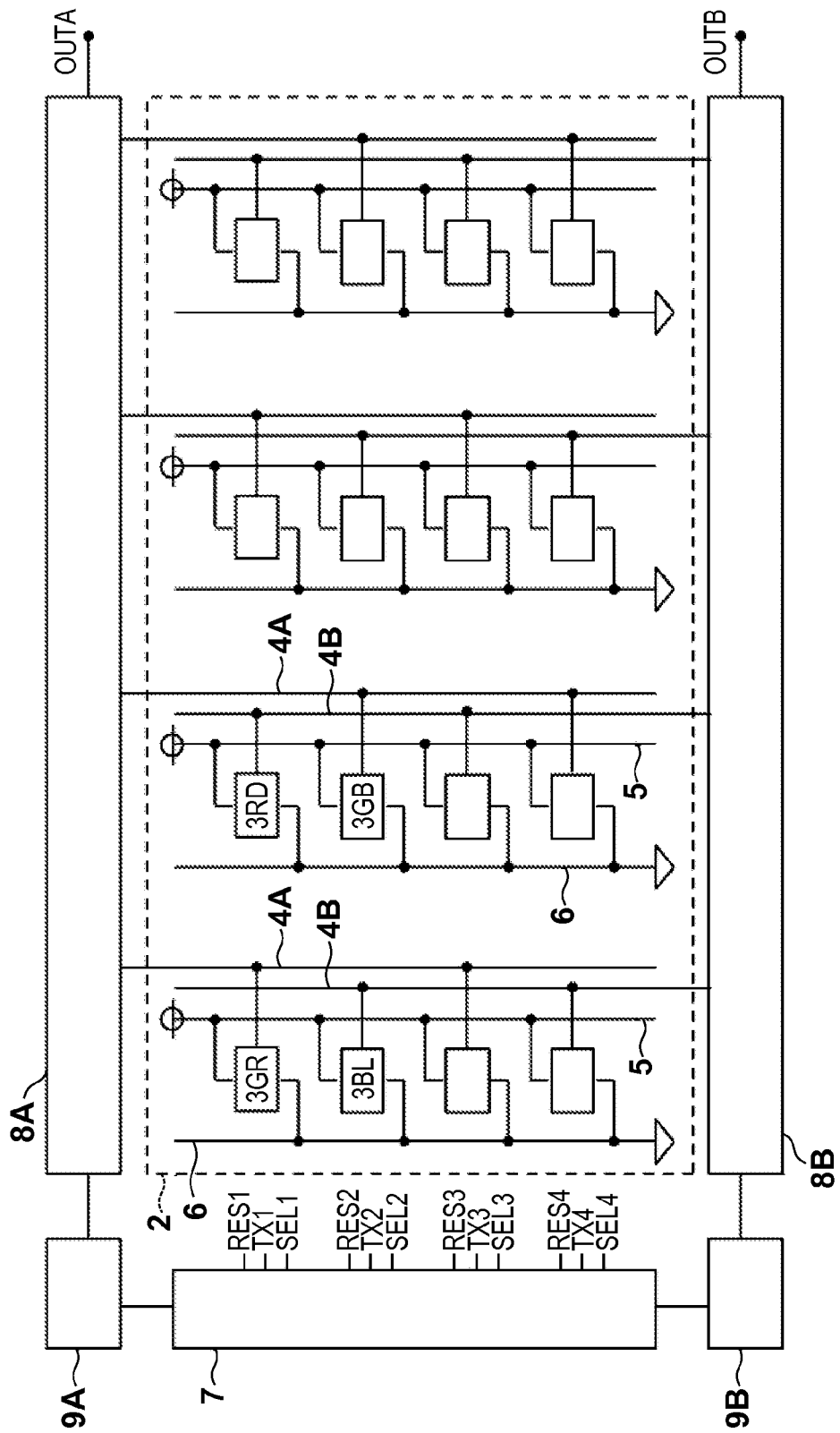
FIG. 7 is a block diagram for explaining an example of the arrangement of a solid-state image sensor according to the second embodiment.
Figure 8:
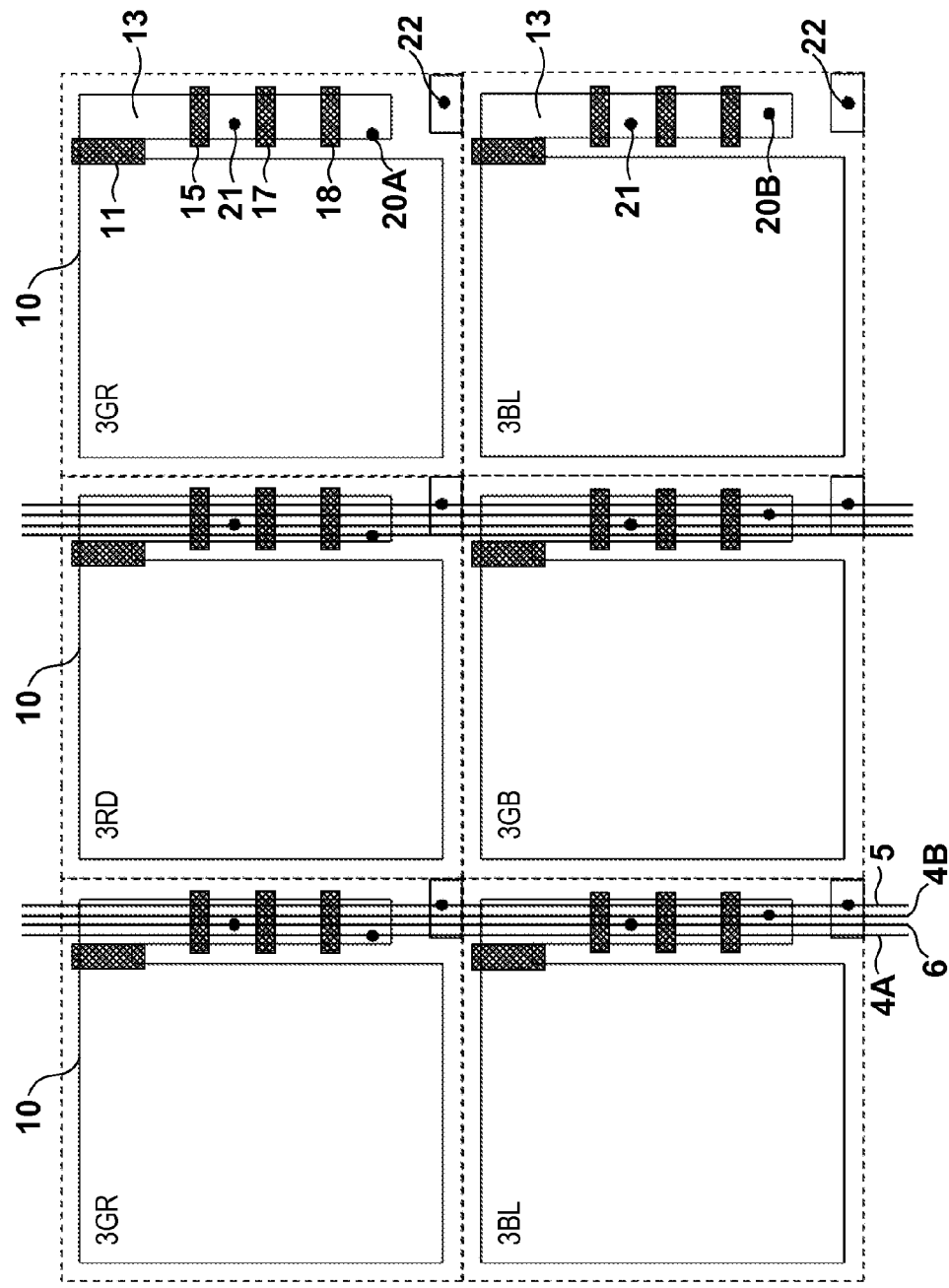
FIG. 8 is a plan view for explaining an example of the layout of a pixel array according to the second embodiment.

A solid-state image sensor $1_2$ according to the second embodiment will be described with reference to FIGS. 6 to 8. The solid-state image sensor $1_2$ is obtained by applying color filters of the Bayer arrangement exemplified in FIG. 6 to the solid-state image sensor $1_1$ in the first embodiment. Of symbols shown in FIG. 6, RD represents a pixel (red pixel) which detects red light, BL represents a pixel (blue pixel) which detects blue pixel, GR and GB represent pixels (green pixels) which detect green light, H represents a column, and L represents a row. FIG. 7 is a block diagram for explaining the arrangement of the solid-state image sensor $1_2$, similar to the first embodiment. A pixel 3RD which detects red light, a pixel 3BL which detects blue light, and pixels 3GR and 3GB which detect green light are illustrated in a pixel array 2. Pixel signal output portions 20 of the pixels 3GR and 3GB are connected to first column signal lines 4A. The pixel signal output portions 20 of the pixels 3RD and 3BL are connected to second column signal lines 4B. FIG. 8 is a plan view schematically showing the layout of 2×3 pixels 3RD, 3BL, 3GR, and 3GB in the pixel array 2 of the solid-state image sensor $1_2$, similar to the first embodiment.

A noise suppression circuit which can be included in a horizontal scanning circuit 8A can clamp in advance, as a noise level, an output obtained when the potential of a node 13 is reset in reading out a pixel signal from each of the pixels 3RD, 3BL, 3GR, and 3GB. Then, the difference between the readout signal and the noise level can be read out to suppress noise, and the resultant signal can be processed as a pixel signal. Since outputs from the pixels 3GR and 3GB undergo a signal process by the common horizontal scanning circuit 8A, noise levels arising from the horizontal scanning circuit 8A can be made uniform. In addition to the effects of the first embodiment, the second embodiment can single out a noise level arising from the horizontal scanning circuit 8A.

Third Embodiment

Figure 9:
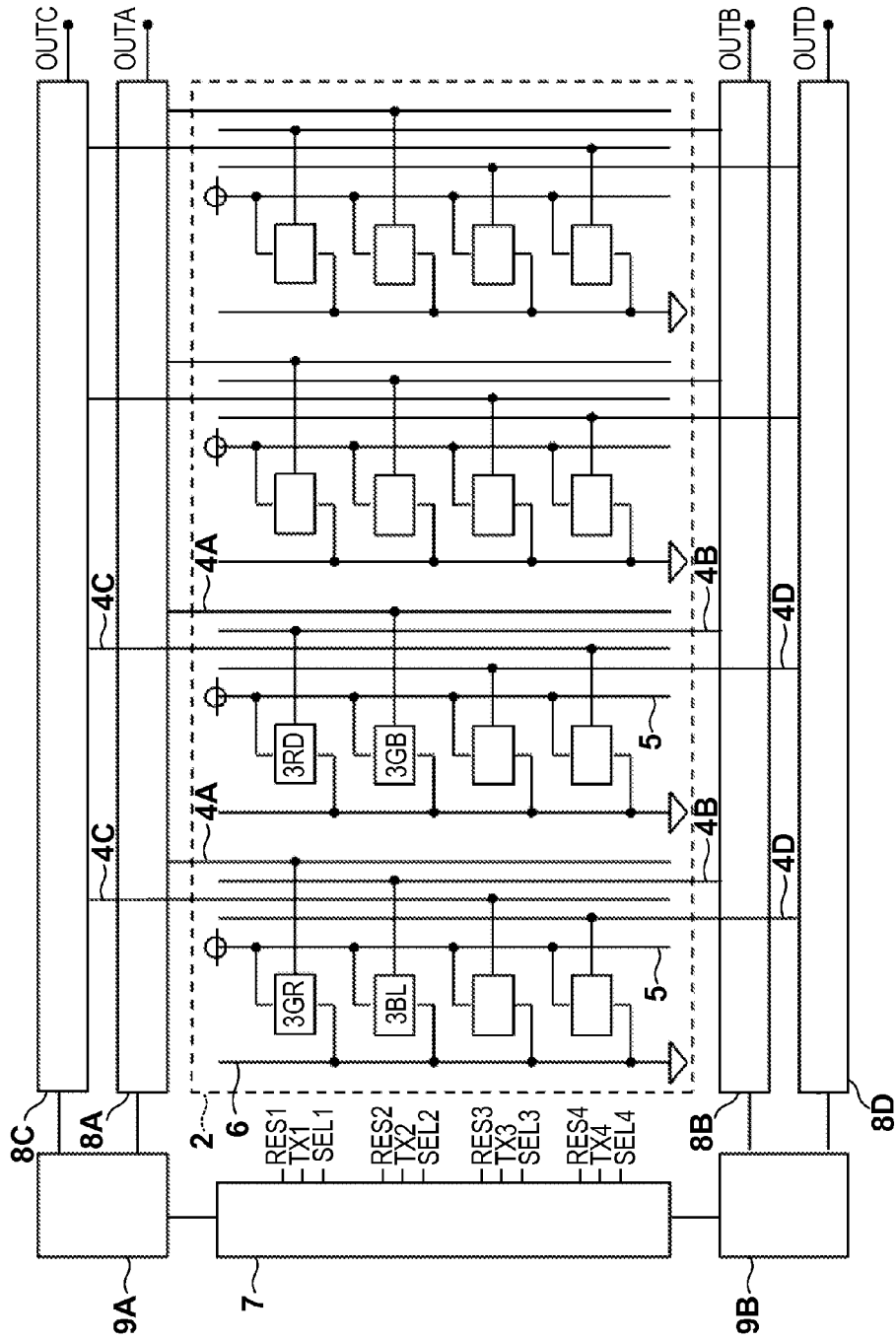
FIG. 9 is a block diagram for explaining an example of the arrangement of a solid-state image sensor according to the third embodiment.
Figure 10:
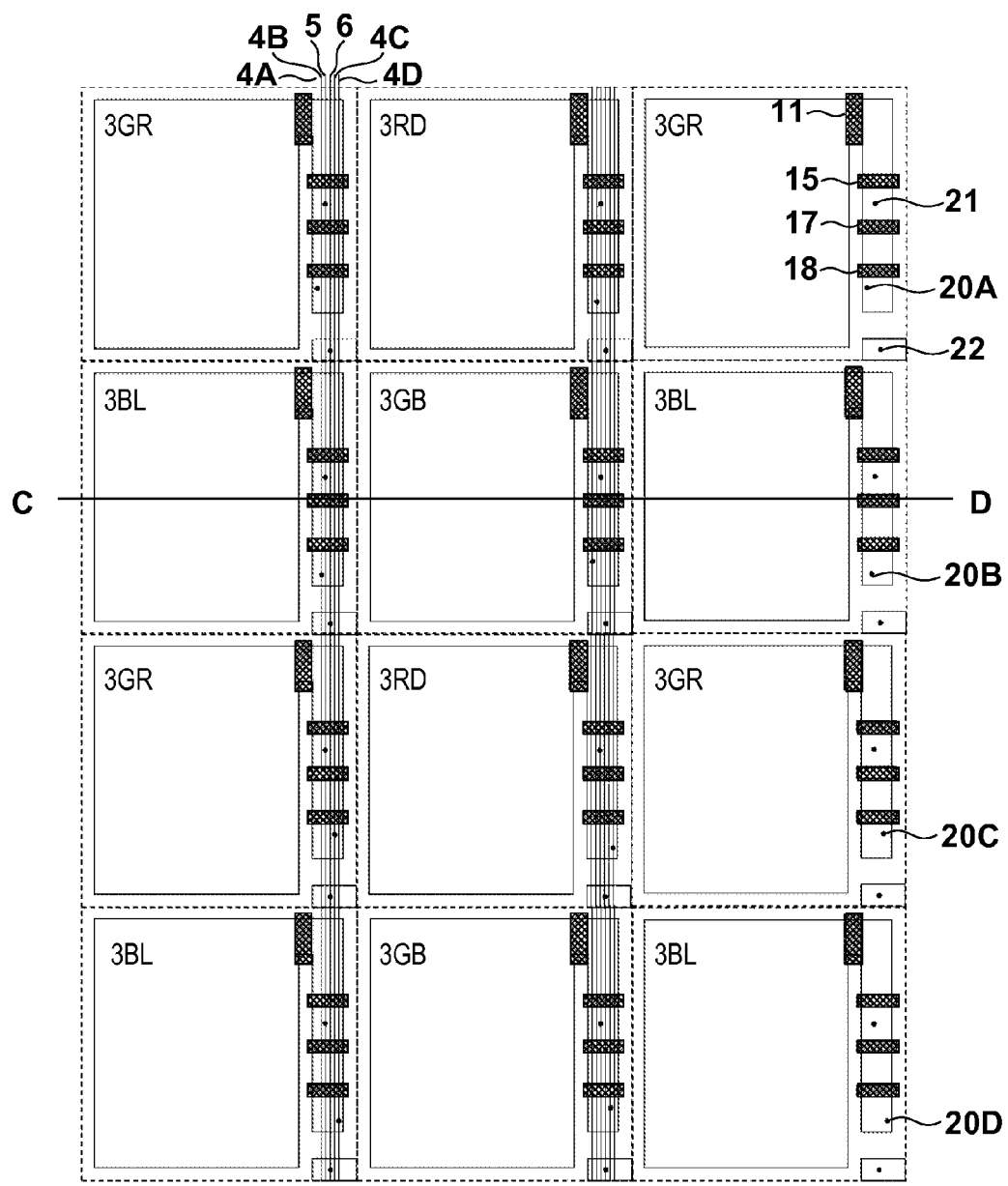
FIG. 10 is a plan view for explaining an example of the layout of a pixel array according to the third embodiment.

A solid-state image sensor $1_3$ according to the third embodiment will be described with reference to FIGS. 9 to 12C. FIG. 9 is a block diagram for explaining the arrangement of the solid-state image sensor $1_3$, similar to the first and second embodiments. The third embodiment is different from the first and second embodiments in that four column signal lines 4A to 4D are arranged at each column of a pixel array 2. Further, color filters of the Bayer arrangement are applied, similar to the second embodiment. Pixel signal output portions 20 of a pixel 3GR on the first row and first column and a pixel 3GB on the second row and second column are connected to the column signal lines 4A. The pixel signal output portions 20 of a pixel 3RD on the first row and second column and a pixel 3BL on the second row and first column are connected to the column signal lines 4B. The pixel signal output portions 20 of the pixel 3GR on the third row and first column and the pixel 3GB on the fourth row and second column are connected to the column signal lines 4C. The pixel signal output portions 20 of the pixel 3RD on the third row and second column and the pixel 3BL on the fourth row and first column are connected to the column signal lines 4D. This also applies to the remaining pixels. FIG. 10 is a plan view schematically showing the layout of 4×3 pixels 3RD, 3BL, 3GR, and 3GB in the pixel array 2 of the solid-state image sensor $1_3$, similar to the first and second embodiments.

Figure 11:
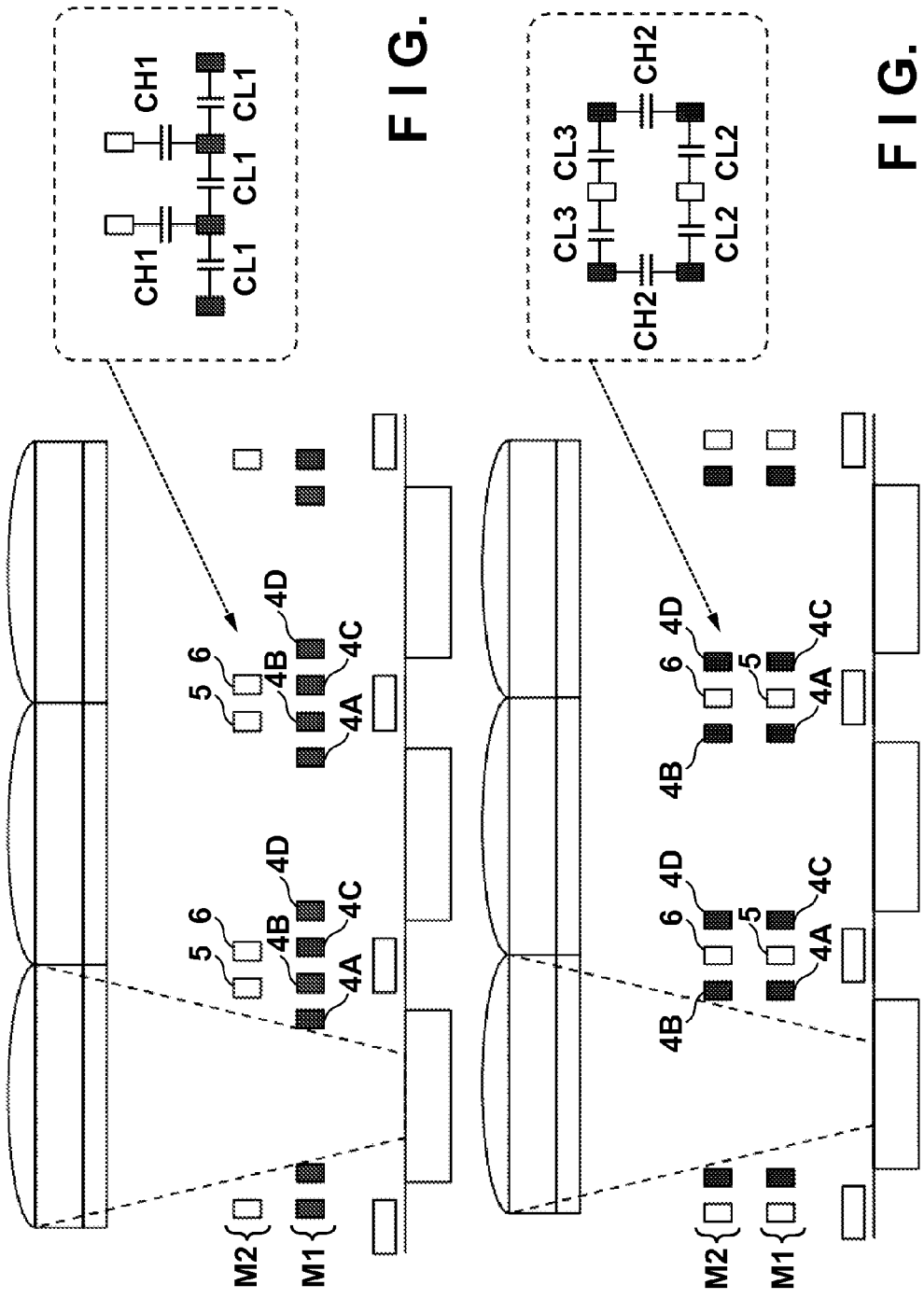
FIG. 11 is a view for explaining a reference example of the arrangement of a solid-state image sensor.
Figure 12:
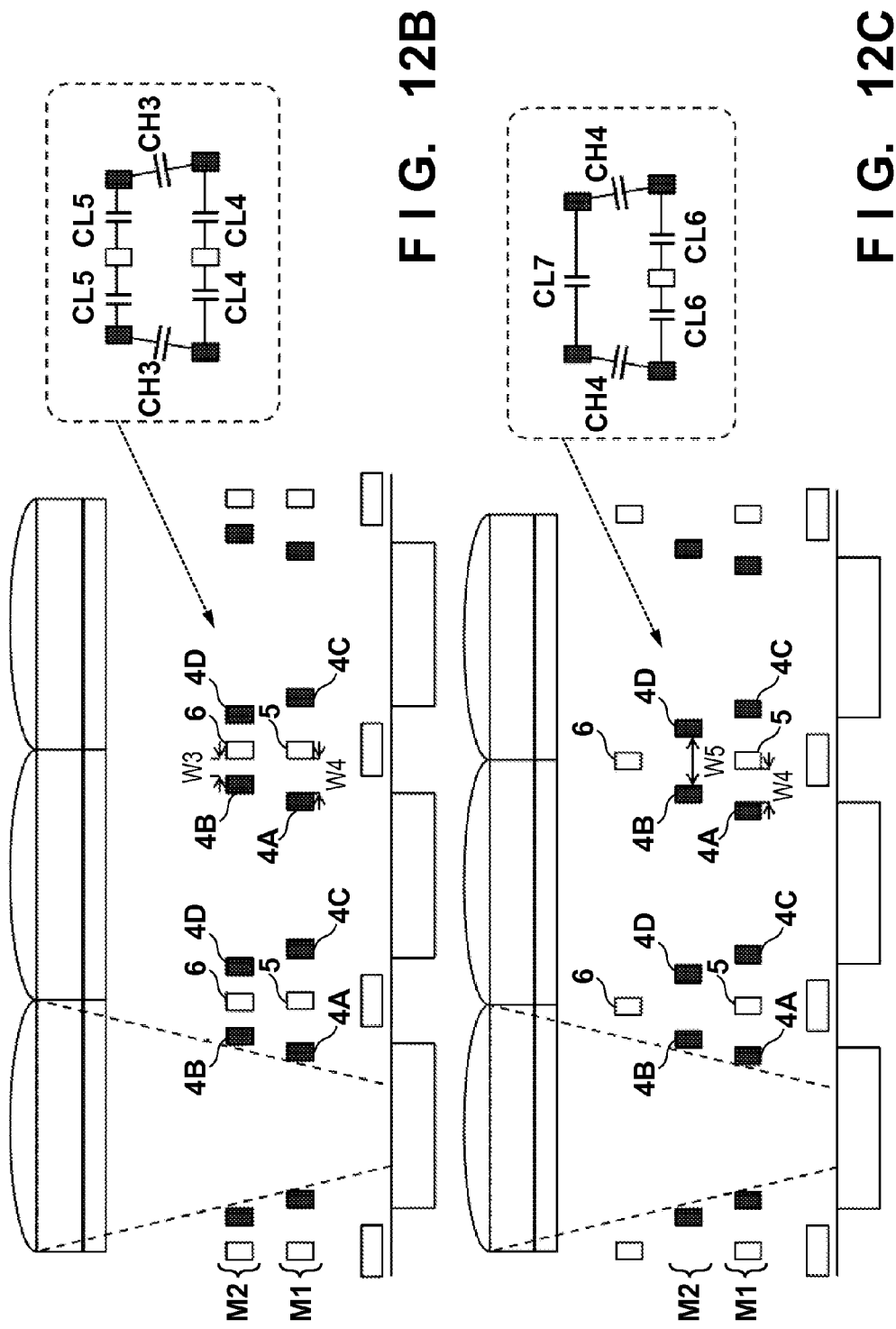
FIGS. 12A to 12C are views for explaining examples of the arrangement of the solid-state image sensor according to the third embodiment.

FIG. 11 schematically shows a reference example of a sectional structure along a cutline C-D in FIG. 10. In this reference example, a first wiring layer M1 includes the column signal lines 4A to 4D. A second wiring layer M2 includes shield patterns (for example, power supply wiring 5 and power supply wiring 6). Parasitic capacitance components which may be generated between adjacent wiring lines are shown on the right side of FIG. 11. Note that a capacitive component (including a fringe capacitive component) between wiring lines adjacent to each other in the horizontal or vertical direction is illustrated. Another capacitive component (for example, between wiring lines positioned in a diagonal direction or wiring lines spaced apart by two or more layers) is small and is not illustrated. CL1 is a capacitive component which may be generated between wiring lines adjacent to each other in the first wiring layer M1. CH1 is a capacitive component which may be generated between the wiring layer of the first wiring layer M1 and that of the second wiring layer M2 immediately above it. At this time, each of capacitive components which may be generated in the column signal lines 4A and 4D is CL1. Each of capacitive components which may be generated in the column signal lines 4B and 4C is 2×CL1+CH1. Hence, the column signal lines may have a capacitance value difference (CL1+CH1). This difference leads to a signal propagation delay difference in the column signal lines 4A to 4D, and the subsequent signal process is rate-determined by a column signal line having a large delay. In the structure of this reference example, adjacent column signal lines may generate signal crosstalk.

FIG. 12A schematically shows a sectional structure along the cutline C-D when the embodiment is applied. At least the first wiring layer M1 out of the first wiring layer M1 and second wiring layer M2 further includes a conductive shield pattern (in this case, the power supply wiring 5). The first column signal line of the first wiring layer M1 includes at least two column signal lines (in this case, the column signal lines 4A and 4C). The shield pattern (power supply wiring 5) is interposed between the two column signal lines 4A and 4C. The second wiring layer M2 also includes two column signal lines (in this case, the column signal lines 4B and 4D), and another shield pattern (in this case, the power supply wiring 6) interposed between the two column signal lines 4B and 4D. Parasitic capacitance components which may be generated between adjacent wiring lines are schematically shown on the right side of FIG. 12A, similar to FIG. 11. CL2 is a capacitive component which may be generated between wiring lines adjacent to each other in the first wiring layer M1. CL3 is a capacitive component which may be generated between wiring lines adjacent to each other in the second wiring layer M2. CH2 is a capacitive component which may be generated between the wiring layer of the first wiring layer M1 and that of the second wiring layer M2 immediately above it. At this time, the capacitive component which may be generated between the column signal lines 4A and 4C, is CL2+CH2. The capacitive component which may be generated between the column signal lines 4B and 4D, is CL3+CH2. The difference between these capacitance values is |CL2−CL3|. Compared to the reference example described above, signal propagation delay differences in the column signal lines 4A to 4D can be suppressed.

As exemplified in FIG. 12A, column signal lines for propagating pixel signals of the same color are preferably arranged to be symmetrical about the shield pattern in the same wiring layer (for example, the column signal lines 4A and 4C or the column signal lines 4B and 4D). In this structure, the capacitive component CH2 between different wiring layers is preferably smaller than each of the capacitive components CL2 and CL3 between adjacent wiring lines in the same wiring layers. A shield pattern may be further added to an immediately upper or lower wiring layer.

As described above, according to the third embodiment, a plurality of column signal lines are arranged in different wiring layers. This arrangement can reduce an area where the optical path is blocked, and suppress a decrease in the aperture ratio of the solid-state image sensor $1_3$. In general, the thickness of an interlayer dielectric film is larger than the distance (for example, the critical dimension which can be decided by the manufacturing process) between wiring lines adjacent to each other in the same wiring layer. Hence, as another effect of the third embodiment, the capacitance between wiring lines in different wiring layers becomes smaller than that between adjacent wiring lines in the same wiring layer, and crosstalk noise between column signal lines can be suppressed. As the crosstalk noise suppression method, shield patterns can be arranged above and below the column signal line and on the left and right sides of it. However, in the embodiment, a shield pattern is arranged only on one side of the column signal line, or above or below it. The third embodiment can suppress even an image signal propagation delay arising from the wiring capacitance.

FIG. 12B schematically shows an application example in which the wiring position is changed from that in the structure of FIG. 12A. That is, the column signal lines 4A and 4C and the shield pattern (power supply wiring 5) in the first wiring layer M1 are arranged at, for example, a distance W4 larger than W3. This can further reduce, for example, generation of a short circuit between wiring lines in the wiring formation process, and increase the yield while ensuring the light receiving amount of a photoelectric conversion portion 10. Parasitic capacitance components which may be generated between adjacent wiring lines are similarly shown on the right side of FIG. 12B. CL4 is a capacitive component which may be generated between wiring lines adjacent to each other in the first wiring layer M1. CL5 is a capacitive component which may be generated between wiring lines adjacent to each other in the second wiring layer M2. CH3 is a capacitive component which may be generated between the wiring layer of the first wiring layer M1 and that of the second wiring layer M2 immediately above it. The distance W4 is decided within, for example, a range where the difference |CL4−CL5| between capacitance values which may be generated in the column signal lines 4A to 4D falls below a permissible value.

In FIG. 12C, the shield pattern (in this case, the power supply wiring 6) is arranged not in the second wiring layer M2 but in another wiring layer (for example, third wiring layer). Similarly, parasitic capacitance components which may be generated between adjacent wiring lines are schematically shown on the right side of FIG. 12C. CL6 is a capacitive component which may be generated between wiring lines adjacent to each other in the first wiring layer M1. CL7 is a capacitive component which may be generated between wiring lines adjacent to each other in the second wiring layer M2. CH4 is a capacitive component which may be generated between the wiring layer of the first wiring layer M1 and that of the second wiring layer M2 immediately above it. At this time, if CL7 is much smaller than CH4, crosstalk between the adjacent column signal lines 4B and 4D can be suppressed. This suffices to be achieved as long as, for example, the capacitance value differences between the wiring capacitances of the column signal lines 4A to 4D fall within a permissible range. In this manner, the shield pattern (power supply wiring 6) may be arranged in another wiring layer (for example, third wiring layer).

Fourth Embodiment

Figure 13:
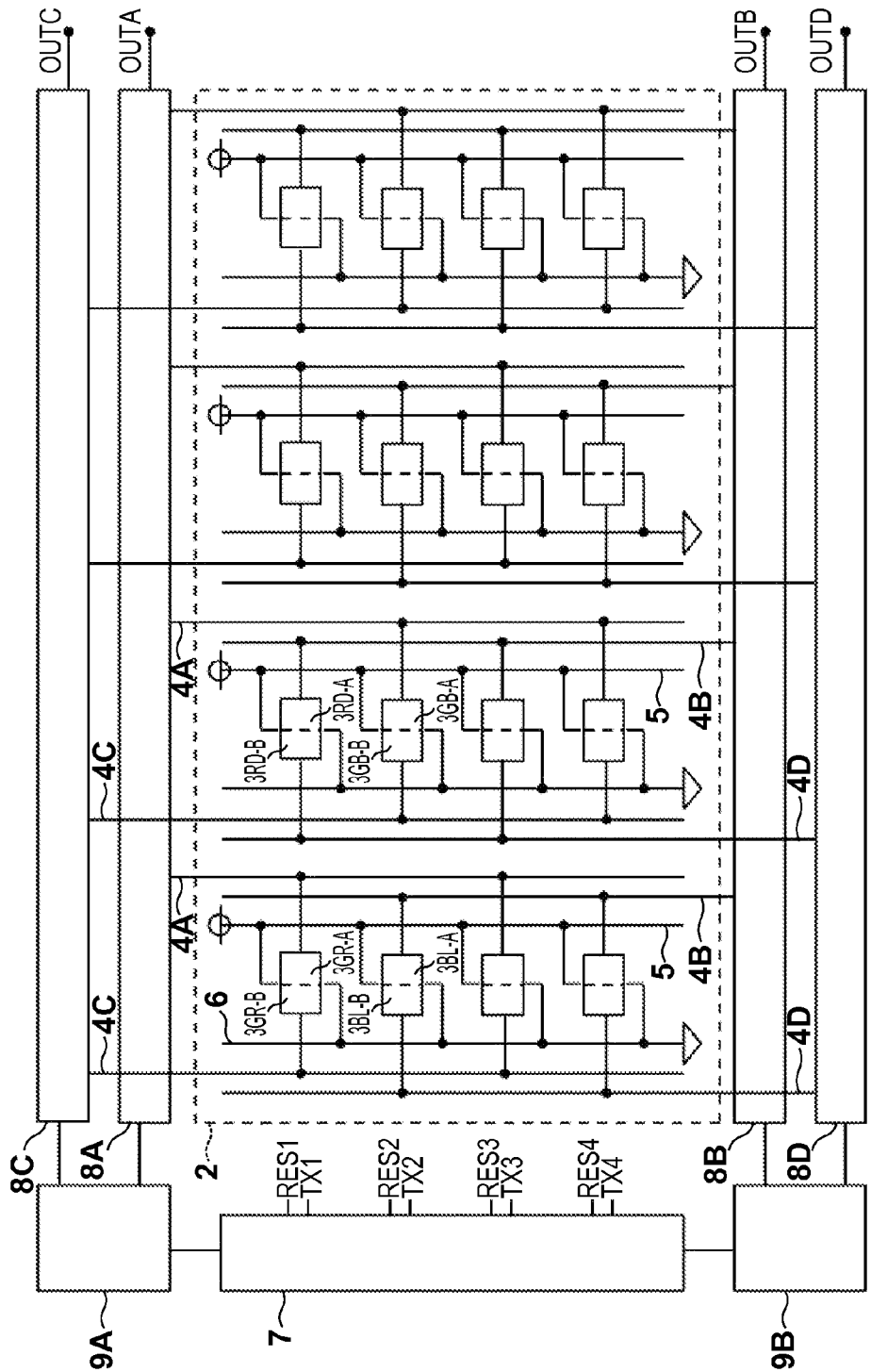
FIG. 13 is a block diagram for explaining an example of the arrangement of a solid-state image sensor according to the fourth embodiment.
Figure 14:
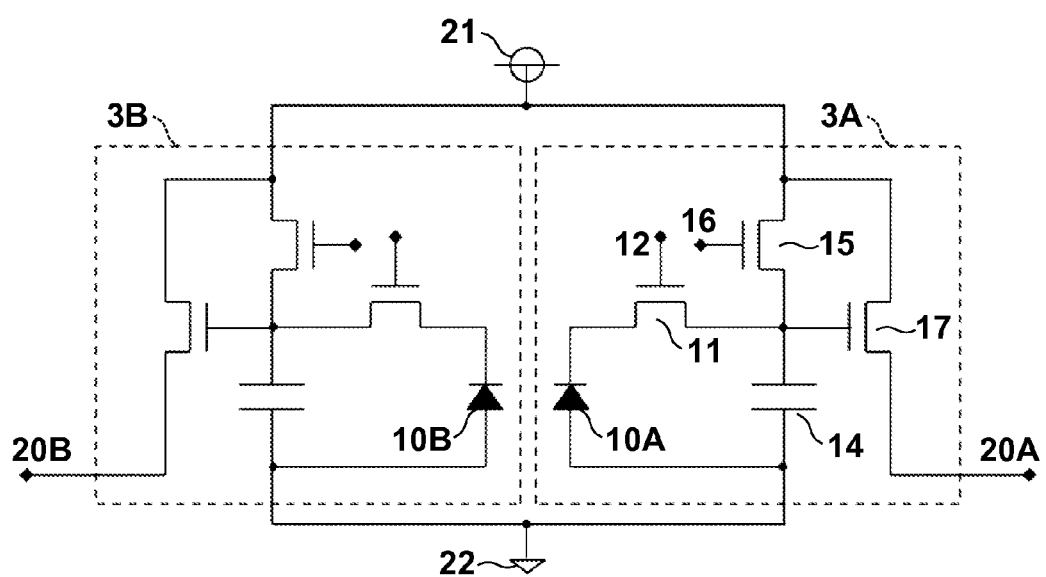
FIG. 14 is a circuit diagram for explaining an example of the arrangement of a unit pixel.
Figure 15:
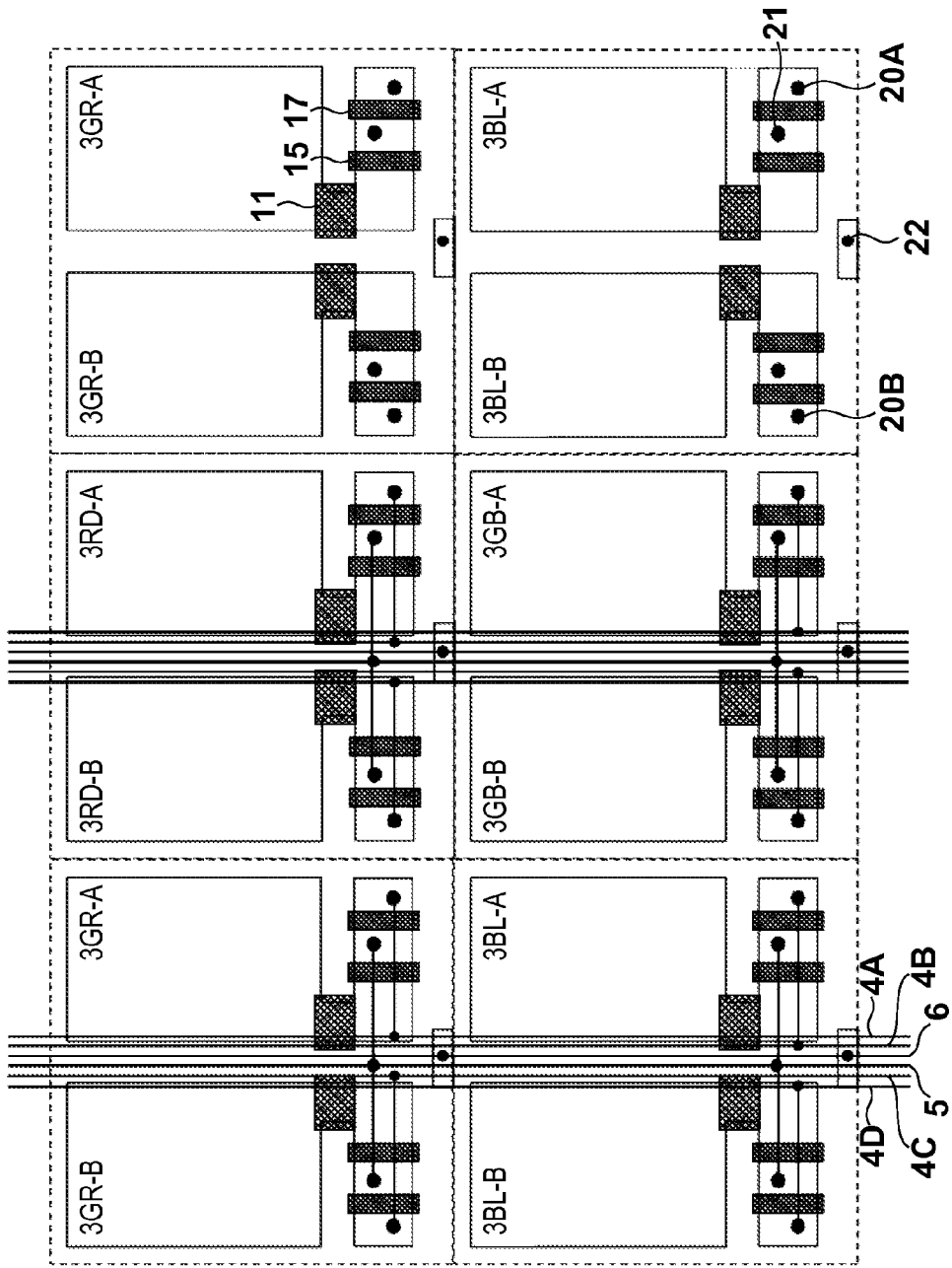
FIG. 15 is a plan view for explaining an example of the layout of a pixel array according to the fourth embodiment.

A solid-state image sensor $1_4$ according to the fourth embodiment will be described with reference to FIGS. 13 to 15. FIG. 13 is a block diagram for explaining the arrangement of the solid-state image sensor $1_4$, similar to the third embodiment. The fourth embodiment is different from the third embodiment in that each unit pixel 3 includes two photoelectric conversion portions (photodiodes 10A and 10B). More specifically, light enters the photodiodes 10A and 10B via a microlens common to them. Signals read out from the photodiodes 10A and 10B contain focus detection signals, and can be used in a focus detection operation to be described later. As exemplified in FIG. 14, each of the photodiodes 10A and 10B is connected to various transistors for reading out signals, including a transfer transistor 11. The unit pixels 3 will be referred to as divided pixels 3RD-A, 3BL-A, 3GR-A, 3GB-A, 3RD-B, 3BL-B, 3GR-B, and 3GB-B. Although a circuit arrangement including no selection transistor 18 is employed in FIG. 14, a circuit arrangement including a selection transistor 18 may be adopted, as described in the first embodiment (FIG. 2).

Pixel signal output portions 20A of the divided pixel 3GR-A on the first row and first column and the divided pixel 3GB-A on the second row and second column are connected to column signal lines 4A. The pixel signal output portions 20A of the divided pixel 3RD-A on the first row and second column and the divided pixel 3BL-A on the second row and first column are connected to column signal lines 4B. Pixel signal output portions 20B of the divided pixel 3GB-B on the first row and first column and the divided pixel 3GR-B on the second row and second column are connected to column signal lines 4C. The pixel signal output portions 20B of the divided pixel 3RD-B on the first row and second column and the divided pixel 3BL-B on the second row and first column are connected to column signal lines 4D. This also applies to the remaining pixels. FIG. 15 is a plan view schematically showing the layout of 2×3 pixels 3 in a pixel array 2 of the solid-state image sensor $1_4$, similar to the first to third embodiments.

In this fashion, when the unit pixel 3 includes the two photodiodes 10A and 10B and their signals are individually read out, the column signal lines 4A to 4D are preferably arranged as in the fourth embodiment. Accordingly, the fourth embodiment can obtain the same effects as those of the first to third embodiments while maintaining the pixel signal reading speed of the pixel array 2.

FIGS. 18A and 18B show modification 1 to the fourth embodiment. The same reference numerals as those in FIGS. 13 to 15 denote portions having the same functions, and a detailed description thereof will not be repeated. FIG. 18A is a plan view schematically showing the layout of 2×3 pixels 3 in the pixel array 2 of the solid-state image sensor $1_4$, similar to FIG. 15. FIG. 18B schematically shows the sectional structure of a portion including the column signal line and power supply wiring. In this modification, as shown in FIG. 18B, on the first column, signals in the divided pixels 3BL-A and 3BL-B are read out in the first wiring layer, and signals in the divided pixels 3GR-A and 3GR-B are read out in the second wiring layer. On the second column, signals in the divided pixels 3RD-A and 3RD-B are read out in the first wiring layer, and signals in the divided pixels 3GB-A and 3GB-B are read out in the second wiring layer. This layout can reduce the influence of color mixing in the column signal lines.

Figure 19:
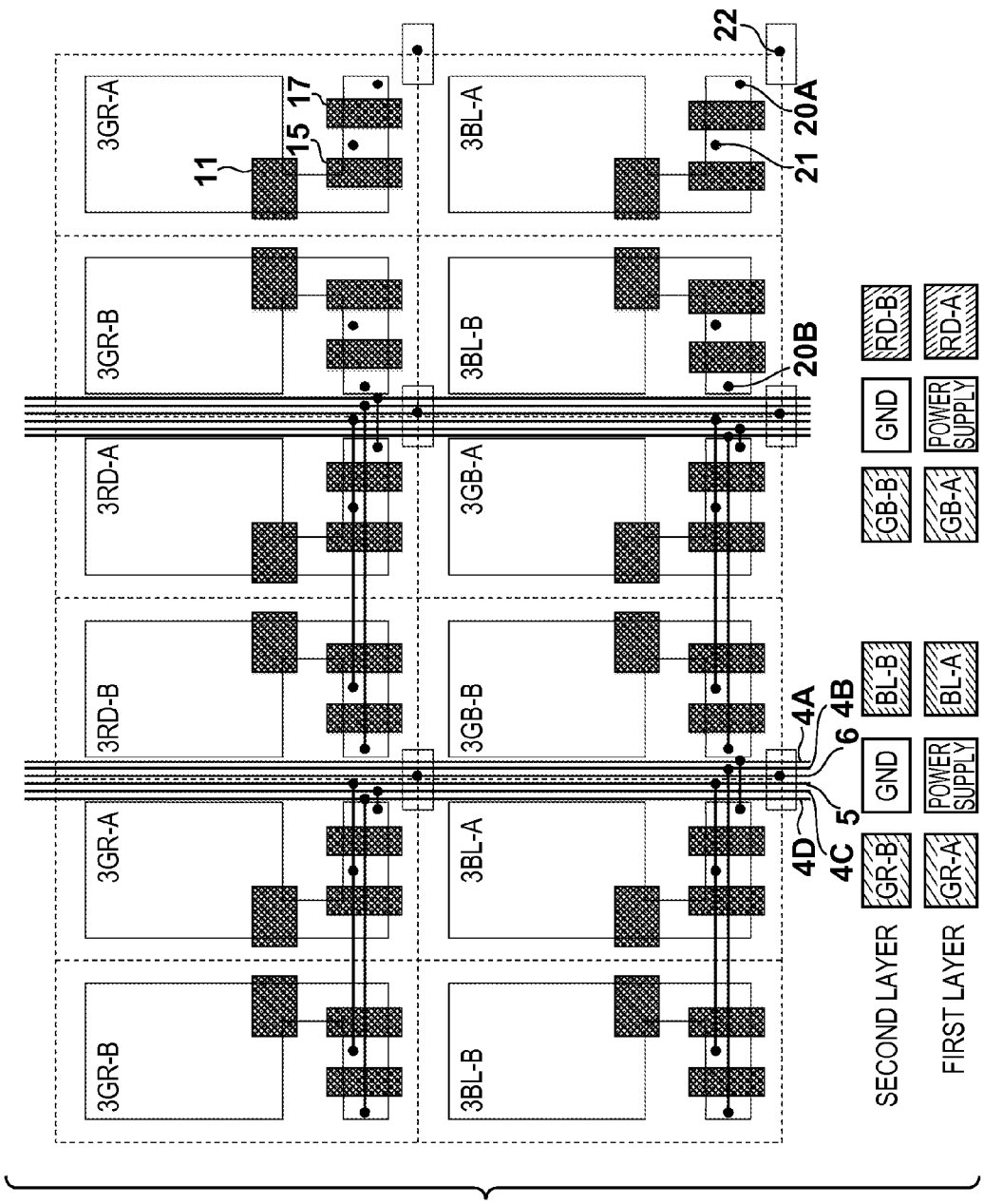
FIG. 19 is a view for explaining another example of the arrangement of the solid-state image sensor.

FIG. 19 shows modification 2, similar to FIGS. 18A and 18B. The difference of modification 2 from modification 1 is the layout of column signal lines. Column signal lines are interposed not between divided pixels, but between adjacent pixels. Further, column signal lines for transferring signals of the same color are distributed to different wiring layers, and arranged close to each other. This layout can reduce the influence of color mixing in the column signal lines because close column signal lines transfer signals of the same color.

Figure 20:
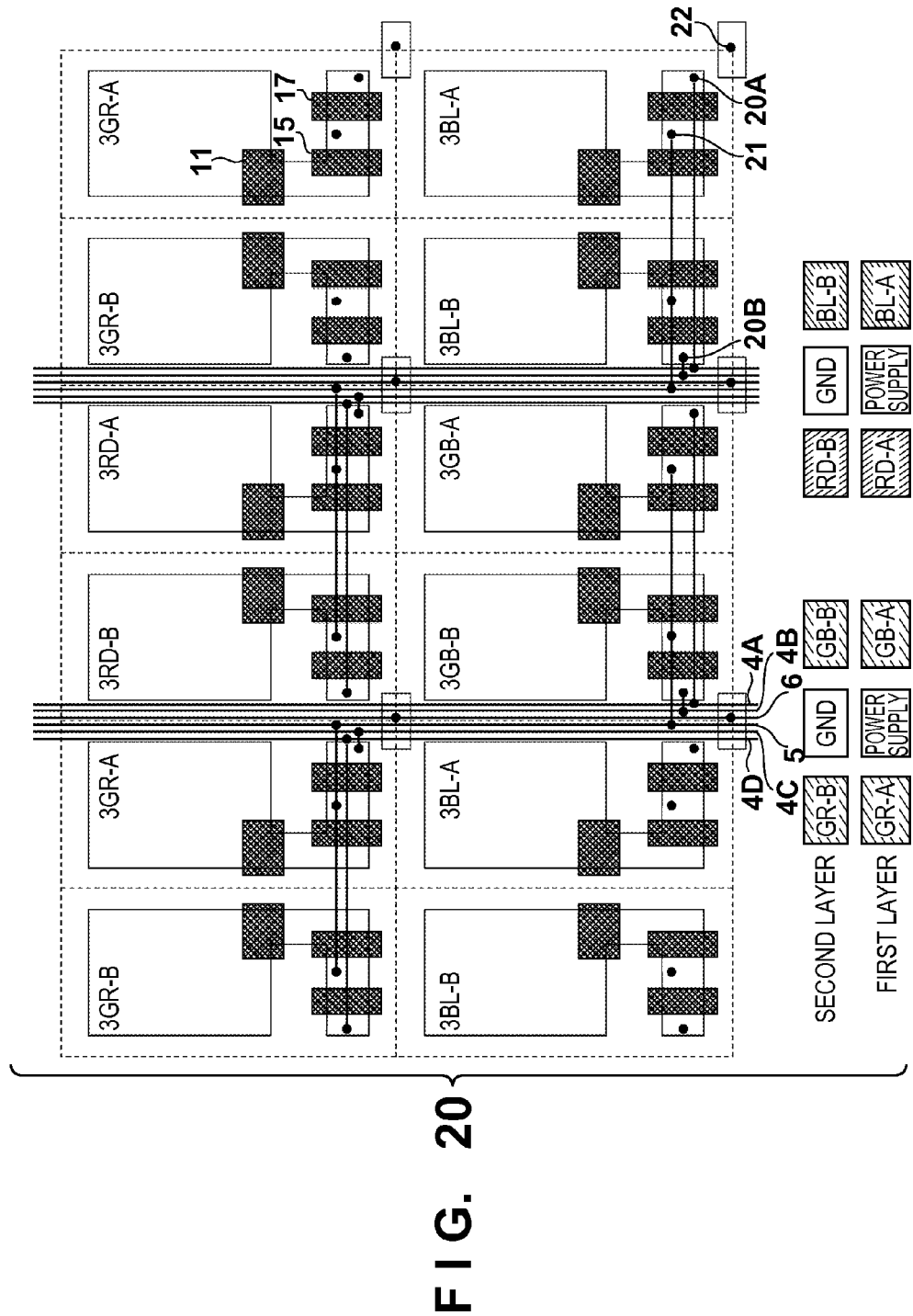
FIG. 20 is a view for explaining still another example of the arrangement of the solid-state image sensor.

FIG. 20 shows modification 3, similar to FIGS. 18A and 18B. The difference of modification 3 from modification 2 is the layout of column signal lines. In modification 3, column signal lines for transferring signals from the divided pixels 3GR-A, 3GR-B, 3GB-A, and 3GB-B are arranged close to each other using two layers. This layout can reduce the influence of color mixing for signals of green pixels in the column signal lines.

An example of the focus detection operation will be explained with reference to FIGS. 16, 17A, and 17B. FIG. 16 is a view schematically showing a state in which a beam emerging from an exit pupil 902 of a photographing lens 900 enters a solid-state image sensor 901. The solid-state image sensor 901 includes a microlens 202, a color filter 301, and two photoelectric conversion portions PD1 and PD2 for each unit pixel. Light having passed through the exit pupil 902 enters the solid-state image sensor 901 using an optical axis 903 as the center. Reference numerals 906 and 907 denote rays at the outermost periphery of light passing through a partial region 904 of the exit pupil 902. Reference numerals 908 and 909 denote rays at the outermost periphery of light passing through another partial region 905 of the exit pupil 902. In FIG. 16, of beams having passed through the exit pupil 902, those illustrated above the optical axis 903 enter the photoelectric conversion portion PD1, and those illustrated below it enter the photoelectric conversion portion PD2. In other words, the photoelectric conversion portions PD1 and PD2 receive beams having passed through different regions of the exit pupil 902 of the photographing lens 900.

For example, signals output from the photoelectric conversion portions PD1 upon receiving light in respective pixels on one column of the pixel array will be defined as the first line data. Similarly, signals output from the photoelectric conversion portions PD2 will be defined as the second line data. For example, based on the difference (phase-difference) between the first line data and the second line data, a processor (not shown) which performs the focus detection operation determines whether an image is in focus.

FIG. 17A shows line data in an in-focus state when a point light source is formed into an image. FIG. 17B shows line data in an out-of-focus state. The abscissa represents the position of each pixel, and the ordinate represents the output value of each pixel. In the in-focus state, the first line data and second line data overlap each other. To the contrary, in the out-of-focus state, the first line data and second line data do not overlap each other. At this time, the processor can calculate, from a shift amount 1001 between these outputs, a distance by which the lens position is moved to focus on the image. The focus detection operation may be executed by the above-described processor. Alternatively, an arithmetic unit configured to execute the focus detection operation may be included in the solid-state image sensor, as needed. A larger difference of the incident light amount may be generated between the photoelectric conversion portions PD1 and PD2 of each pixel in the peripheral region of the pixel array than in the center region. Thus, focus detection pixels are preferably arranged in the peripheral region of the pixel array.

Next, generation of image data in this pixel arrangement will be described. As described above, signals output from the two photoelectric conversion portions PD1 and PD2 are separately read out and used for focus detection. The signals output from the photoelectric conversion portions PD1 and PD2 in response to light entering each pixel 3 are added, obtaining the pixel signal of the pixel 3. For example, when the amount of charges generated and accumulated in one of the photoelectric conversion portions PD1 and PD2 reaches the saturated state, a sequence to determine that the reliability of the signal is poor, and not to perform phase detection or to stop it can be adopted. In this way, the above operation may be controlled in accordance with the states (charge amounts and signals) of the photoelectric conversion portions PD1 and PD2.

Although the four embodiments have been described, the present invention is not limited to them. The purpose, state, application, function, and other specifications can be properly changed, and the present invention can be practiced by another embodiment, as a matter of course. For example, the arrangement of the column signal lines 4A to 4D is not limited to these embodiments. The column signal lines 4A and 4C may be arranged in the second wiring layer M2, and the column signal lines 4B and 4D may be arranged in the first wiring layer M1. The power supply wiring 5 for VDD power and the power supply wiring 6 for ground (GND) are used for the conductive shield patterns in each of the above embodiments, but wiring lines for another application may be used. Color filters of the Bayer arrangement are used in each of the above embodiments, but color filters of another array may be used or color filters may be implemented by monochrome sensors. The pixel array 2 has been described as a CMOS image sensor in each of the above embodiments, but may be another sensor. All or part of the operation of each functional block in each of the above embodiments may be controlled by an OS or the like running on a computer, together with or instead of the computer.

A solid-state image sensor incorporated in a camera has been described. However, the concept of the camera includes not only an apparatus mainly for shooting, but also an apparatus accessorily having the a shooting function (for example, a personal computer or a mobile terminal). The camera can include the solid-state image sensor according to the present invention which has been exemplified in the embodiments, and a processor which processes a signal output from the solid-state image sensor. The processor can include, for example, an A/D converter, and a processor which processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2012-008447, filed Jan. 18, 2012 and 2012-281754, filed Dec. 25, 2012, which are hereby incorporated by reference herein in their entirety.

What is claimed is:

1. A solid-state image sensor including a pixel array in which a plurality of pixels are arrayed in a matrix having a plurality of rows and a plurality of columns, comprising:

a first photoelectric conversion portion provided in a first pixel;

a second photoelectric conversion portion provided in the first pixel;

a third photoelectric conversion portion provided in a second pixel, the second pixel being located in a row differing from a row in which the first pixel is located;

a fourth photoelectric conversion portion provided in the second pixel;

a first wiring layer including first column signal lines which correspond to each of the respective plurality of columns;

a second wiring layer, arranged above the first wiring layer, including second column signal lines which correspond to each of the respective plurality of columns;

a color filter, corresponding to both the first photoelectric conversion portion and the second photoelectric conversion portion, through which an incident light passes to the first photoelectric conversion portion and the second photoelectric conversion portion; and a microlens, corresponding to both the first photoelectric conversion portion and the second photoelectric conversion portion, configured to guide an incident light to the first photoelectric conversion portion and the second photoelectric conversion portion, wherein the first column signal lines include two column signal lines for outputting each of signals from the first photoelectric conversion portion and the third photoelectric conversion portion, and the second column signal lines include two column signal lines for outputting each of signals from the second photoelectric conversion portion and the fourth photoelectric conversion portion.

2. The sensor according to claim 1, wherein the second pixel is located in a column differing from a column in which the first pixel is located.

3. The sensor according to claim 1, wherein
the plurality of pixels are arrayed according to a Bayer arrangement,
the two column signal lines of the first column signal lines propagate pixel signals of a first same color, and
the two column signal lines of the second column signal lines propagate pixel signals of a second same color.

4. The sensor according to claim 1, wherein
the plurality of pixels are arrayed according to a Bayer arrangement, and
one of the two column signal lines of the first column signal lines and one of the two column signal lines of the second column signal lines propagate pixel signals of a same color.

5. The sensor according to claim 1, wherein
the plurality of pixels are arrayed according to a Bayer arrangement, and
both of the two column signal lines of the first column signal lines and both of the two column signal lines of the second column signal lines propagate pixel signals of a same color.

6. The sensor according to claim 1, wherein a signal from the first photoelectric conversion portion and a signal from the second photoelectric conversion portion are used as focus detection signals.

7. A camera comprising:
a solid-state image sensor; and
a processor which processes a signal output from the solid-state image sensor,
wherein the solid-state image sensor includes a pixel array in which a plurality of pixels are arrayed in a matrix having a plurality of rows and a plurality of columns, comprising:
a first photoelectric conversion portion provided in a first pixel;
a second photoelectric conversion portion provided in the first pixel;
a third photoelectric conversion portion provided in a second pixel, the second pixel being located in a row differing from a row in which the first pixel is located;
a fourth photoelectric conversion portion provided in the second pixel;
a first wiring layer including first column signal lines which correspond to each of the respective plurality of columns;
a second wiring layer, arranged above the first wiring layer, including second column signal lines which correspond to each of the respective plurality of columns;

a color filter, corresponding to both the first photoelectric conversion portion and the second photoelectric conversion portion, through which an incident light passes to the first photoelectric conversion portion and the second photoelectric conversion portion; and
a microlens, corresponding to both the first photoelectric conversion portion and the second photoelectric conversion portion, configured to guide an incident light to the first photoelectric conversion portion and the second photoelectric conversion portion,
wherein the first column signal lines include two column signal lines for outputting each of signals from the first photoelectric conversion portion and the third photoelectric conversion portion, and
the second column signal lines include two column signal lines for outputting each of signals from the second photoelectric conversion portion and the fourth photoelectric conversion portion.

8. A solid-state image sensor including a pixel array in which a plurality of pixels are arrayed in a matrix having a plurality of rows and a plurality of columns, wherein
the plurality of pixels includes a first pixel being located in (M)th row and (N)th column, a second pixel being located in (M+1)th row and (N)th column, and a third pixel being located in (M+1)th row and (N+1)th column, each of M and N being an arbitrary integer,
the sensor comprises:
a first microlens corresponding to the first pixel;
a first photoelectric conversion portion corresponding to the first pixel, the first microlens guiding an incident light to the first photoelectric conversion portion;
a second photoelectric conversion portion corresponding to the first pixel, the first microlens guiding an incident light to the second photoelectric conversion portion;
a second microlens corresponding to the second pixel;
a third photoelectric conversion portion corresponding to the second pixel, the second microlens guiding an incident light to the third photoelectric conversion portion;
a fourth photoelectric conversion portion corresponding to the second pixel, the second microlens guiding an incident light to the fourth photoelectric conversion portion;
a third microlens corresponding to the third pixel;
a fifth photoelectric conversion portion corresponding to the third pixel, the third microlens guiding an incident light to the fifth photoelectric conversion portion;
a sixth photoelectric conversion portion corresponding to the third pixel, the third microlens guiding an incident light to the sixth photoelectric conversion portion;
a first signal line configured to read out a signal from the first photoelectric conversion portion;
a second signal line configured to read out a signal from the second photoelectric conversion portion;
a third signal line configured to read out a signal from the third photoelectric conversion portion;
a fourth signal line configured to read out a signal from the fourth photoelectric conversion portion;
a fifth signal line configured to read out a signal from the fifth photoelectric conversion portion; and
a sixth signal line configured to read out a signal from the sixth photoelectric conversion portion, and the first signal line and the second signal line are provided in a wiring layer, in which the fifth signal line and the sixth signal line are also provided, the wiring layer differing from a wiring layer in which the third signal line and the fourth signal line are provided.

9. The sensor according to claim 8, further comprising a color filter of a green color provided to each of the first pixel and the third pixel.

10. The sensor according to claim 8, wherein, in a view in a direction perpendicular to the pixel array,
    one of the first signal line and the second signal line is located between each pixel located in (N)th column and each pixel located in (N+1)th column, and
    one of the fifth signal line and the sixth signal line is located between each pixel located in (N)th column and each pixel located in (N+1)th column.

* * * * *